United States Patent [19]

Weingand

[11] Patent Number: 5,679,979

[45] Date of Patent: Oct. 21, 1997

[54] SURFACE MOUNT PACKAGE WITH HEAT TRANSFER FEATURE

[76] Inventor: Christopher Dirk Weingand, 23 A Holton St., Woburn, Mass. 01801-5232

[21] Appl. No.: 646,802

[22] Filed: May 21, 1996

[51] Int. Cl.[6] .................. H01L 33/00; H01L 31/12; H01L 23/02
[52] U.S. Cl. .................. 257/723; 257/81; 257/82; 257/173; 257/275; 257/276; 257/290
[58] Field of Search .................. 257/723, 46, 80–85, 257/104, 105, 121, 173–175, 260, 275–281, 288, 290, 458, 544

[56] References Cited

U.S. PATENT DOCUMENTS

| | | | |
|---|---|---|---|
| 3,745,423 | 7/1973 | Kasano | 257/94 |
| 4,847,848 | 7/1989 | Inoue et al. | 257/81 |
| 5,014,159 | 5/1991 | Butt | 361/386 |
| 5,045,914 | 9/1991 | Casto et al. | 257/70 |
| 5,132,875 | 7/1992 | Plesinger | 361/386 |
| 5,227,646 | 7/1993 | Shigeno | 257/80 |
| 5,262,927 | 11/1993 | Chia et al. | 361/784 |
| 5,280,409 | 1/1994 | Selna et al. | 361/720 |
| 5,423,358 | 6/1995 | Nelson et al. | 257/5 |
| 5,459,356 | 10/1995 | Schulze et al. | 257/692 |
| 5,463,250 | 10/1995 | Nguyen et al. | 257/692 |
| 5,513,070 | 4/1996 | Xie et al. | 361/700 |
| 5,532,506 | 7/1996 | Tserng | 257/728 |

FOREIGN PATENT DOCUMENTS

| | | | |
|---|---|---|---|
| 54-12284 | 1/1979 | Japan | 257/81 |
| 58-199573 | 11/1983 | Japan | 257/84 |
| 59-105392 | 6/1984 | Japan | 257/81 |
| 63-142684 | 6/1988 | Japan | 257/81 |
| 340466 | 11/1989 | Japan | 257/692 |
| 5-67768 | 3/1993 | Japan | 257/82 |

*Primary Examiner*—Tom Thomas
*Assistant Examiner*—Alexander Oscar Williams

[57] ABSTRACT

A package (1) for diodes (6) is constructed with a substrate (2) of alumina, a common area (5) on which diodes (6) are mounted, bond wires (8) extending from respective diodes to connect with respective conducting output areas (9) respective vias (13) connecting the common area (5) and the output areas (9) to respective surface mount pads (14, 18) on a bottom surface of the substrate (2), heat spreading areas (19) on the top surface of the substrate (2), and multiple conducting vias (13) connecting each of the heat spreading areas (19) to a heat conducting, surface mount, ground pad (20) on the bottom surface of the substrate (2).

8 Claims, 2 Drawing Sheets

SURFACE MOUNT PACKAGE WITH HEAT TRANSFER FEATURE

FIELD OF THE INVENTION

The present invention relates to the technical field of packages for diodes, especially for diodes with RF performance.

BACKGROUND OF THE INVENTION

Diodes, particularly PIN diodes, are available as packaged diodes, wherein the diodes are encapsulated in a package, and the diodes have projecting electrical pins or electrical leads that project from the package for solder connection to circuit traces on a circuit board. In the past, the package for diodes diodes have been mounted directly on a circuit board together with various other electronic components to comprise an electronic circuit. One of the problems associated with the packaged diode resides in exposure of the electrical leads to being influenced by capacitance attributed to various other electrical components that are mounted on the circuit board. Packaged diodes are available with surface mount terminations in place of projecting electrical leads. However, the surface mount terminations add excess capacitance across the junctions of the diodes. The encapsulant material adds further capacitance across the junctions of the encapsulated diodes.

Because of capacitance added by the package construction, it has been difficult in the past to use packaged diodes for RF performance, for example, for 2 gHz. performance. Diodes for RP performance require minimized capacitance introduced by the package across the diode junctions.

In addition diodes for RF transmit applications require good thermal dissipation to remove heat from the diodes, to keep insertion losses low, and to maintain reliable operation over time. Another of the problems associated with the packaged diode is an inability of the package to dissipate heat from the operating diodes. The diodes that are encapsulated in the package have shortened lifetimes and increased risk of failure when the heat is insufficiently dissipated.

SUMMARY OF THE INVENTION

An objective of the invention is to provide a package for diodes having good thermal dissipation and minimized package capacitance. According to the invention, a package for diodes is constructed with heat spreaders on a thermally dissipating substrate, which improves heat dissipation. Heat dissipation is further improved by an embodiment of the invention that provides enlarged surface mount terminals connected by conducting vias to the heat spreaders.

According to an embodiment, the package for diodes comprises a hollow insulating cover that eliminates encapsulant material that would have added excess capacitance across the junctions of the encapsulated diodes.

According to a further embodiment, outputs of the diodes in the package for diodes connect with output pads on the package for diodes, and capacitance is minimized by electrical ground areas positioned among the output pads.

Embodiments of the invention will now be described by way of example with reference to the accompanying drawings, according to which:

DETAILED DESCRIPTION OF THE PREFERRED EMBODIMENT

With reference to FIGS. 1–6 of the drawings, two embodiments of a package (1) for diodes will be described with various component parts being in common to both embodiments. The package (1) is adapted for mounting on a circuit board. The package (1) for diodes comprises, a flat substrate (2) of known alumina material having a top surface (3) and a bottom surface (4).

Figure 1:
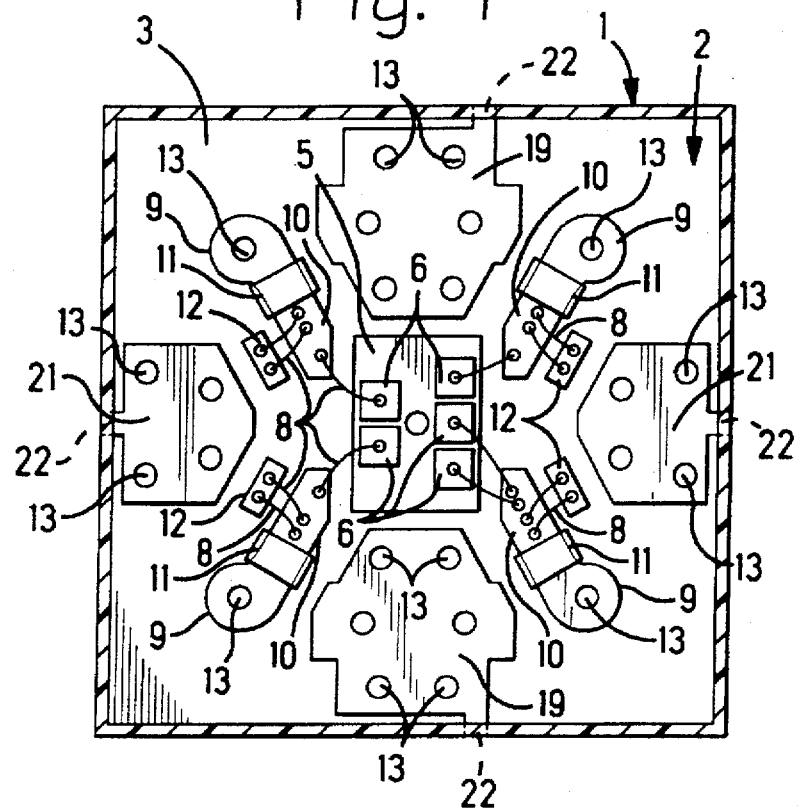
FIG. 1 is a plan view of a package for diodes with a cover shown in section.
Figure 4:
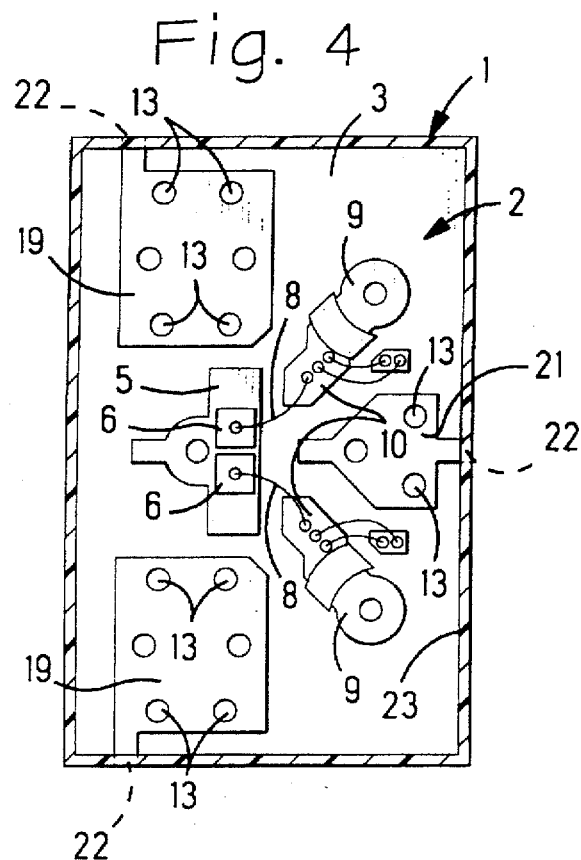
FIG. 4 is a plan view of a package for diodes with a cover shown in section.

With reference to FIGS. 1 and 4, a common area (5) on the top surface (3) is constructed of metallic conducting material known as metallization, such as copper as an underlayment that is covered by a flash of precious metal, such as gold. The common area (5) provides a mounting surface on which at least one diode (6), or alternatively, multiple diodes (6), can be mounted and electrically attached to a conducting common port, such as by corresponding epoxy attach or solder joints (7), FIGS. 2 and 5, to the common area (5). Each of the diodes (6) is a discrete PIN diode chip, for example, available from M/A-COM Inc., 1011 Pawtucket Boulevard, Lowell Mass. 01853, USA, Part Number FN00008 or MA4PC723-2 and MA4PC723-4. Other suggested sources of supply exist for the equivalent part numbers. For example, Alpha Industries, 20 Sylvan Road, Woburn, Mass. 01801, USA, and Loral Microwave -FSI, Semiconductor Division, 16 Maple Road, Chelmsford, Mass. 01824., USA.

A metallization is known, in the field of package manufacturing, to comprise, a layer of conducting material applied to a surface of a substrate, such as the substrate (2), by deposition techniques that include; plating, printing and vapor deposition, for example. In each of the present embodiments, a metallization is a conducting layer of sufficient thickness to withstand a process of attachment thereto of a bond wire or a solder joint, or of a sufficient thickness to promote heat conduction and spreading.

With reference to FIGS. 1 and 4, bond wires (8) extend from respective active areas on the diodes (6) to connect with respective conducting output areas (9) on the top surface (3). The output areas (9) are also metallization, such as copper, as an underlayment, covered and adhered to by a flash of precious metal, such as gold. In addition, thick film gold pads (10) are applied to a portion of the gold flash, to which respective bond wires (8) are attached. A dam (11) is provided by an insulating strip of glass deposited as an overglaze that extends across the corresponding output area (9) to divide the output area (9) into two surface portions. Each dam (11) resists wicking and spreading of the thick film gold as it is being applied, and thus confines an outer edge of the corresponding thick film gold pad (10) to the portion of the output area. Accordingly, gold consumption is reduced. The thick film gold pads (10) are designed to be short 50 Ohm thick film transmission lines, with the adjacent ground areas (21) assisting to control the impedance of the thick film transmission lines. Thick film capacitor pads (12) are on the top surface (3) of the substrate (2), adjacent to respective output areas (9). Wire bonds (8) connect the capacitor pads (12) with the thick film gold, output areas (9) to compensate for inductance in the bond wires (8) extending from respective diodes (6).

Figure 2:
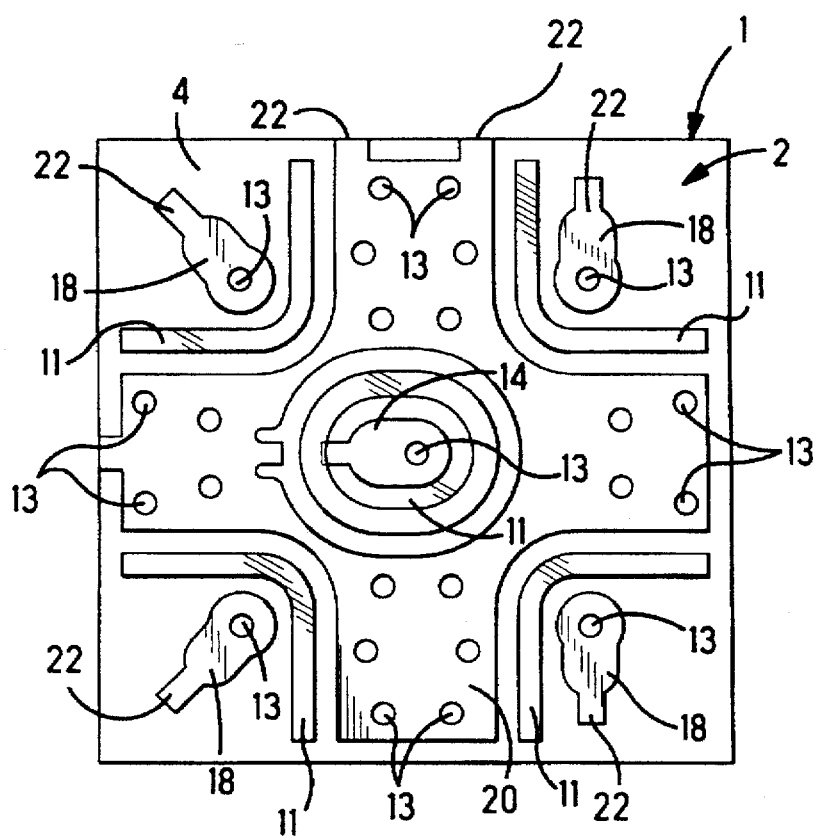
FIG. 2 is a plan view of a bottom surface of a package as shown in FIG. 1.
Figure 5:
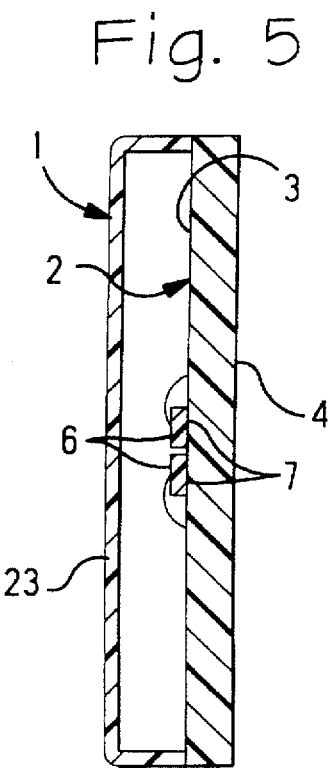
FIG. 5 is a plan view of a bottom surface of a package as shown in FIG. 4.
Figure 7:
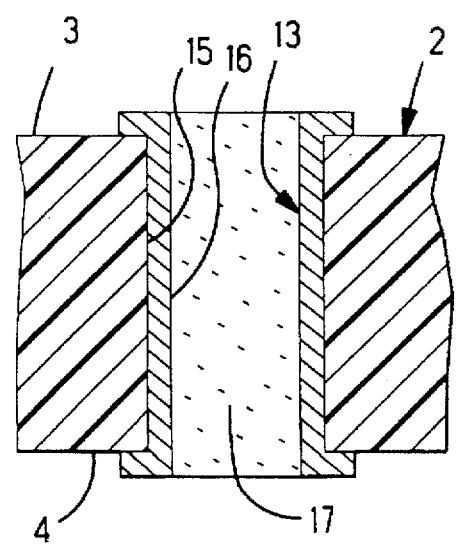
FIG. 7 is a section view of a via in the package as shown in FIG. 1 and in FIG. 4.

With respect to FIGS. 2 and 5, the common area (5) is connected by at least one conducting via (13) to a surface mount pad, more particularly, a common pad (14), on the bottom surface (4) of the substrate (2). For example, each via (13), with reference to FIG. 7, is an aperture (15) through the substrate (2), lined with conductive plating (16), and extending from the top surface (3) to the bottom surface (4). Each aperture (15) is filled with a sealant (17), epoxy, for example, thereby to seal the top surface (3) from the bottom surface (4).

In FIGS. 1 and 4, adjacent diodes (6) are separated by a 0.003 inch gap that is centered on the common area (5). In addition, the adjacent diodes (6) are equidistant from a via (13). By way of example, each of the diodes (6) is approximately 0.013 to 0.018 inches square, and is approximately 0.005 to 0.012 inches in height. As shown in FIG. 1, two diodes (6) can be joined to the same portion (10) of an output area (9) when increased power output is desired.

Each of the output areas (9) is connected by at least one conducting via (13) to respective surface mount pads, more particularly, output pads (18), FIGS. 2 and 5, on the bottom surface (4) of the substrate (2).

Heat spreading areas (19) on the top surface (3) of the substrate (2) are constructed as metallization, for example, copper, covered by a flash of gold. The heat spreading areas (19) are separated from the common area (5) by slender gaps, across which heat transfer occurs. Alumina is heat conductive to transfer heat across the gaps to the heat spreading areas (19) that are shown in the drawings as being disconnected from said bond wires (8) and said conducting output areas (9).

Multiple conducting vias (13) connect each of the heat spreading areas (19) to a corresponding heat conducting, surface mount pad, more particularly, a ground pad (20) on the bottom surface (4) of the substrate (2). The ground pad (20) is larger in area than the combined area of the heat spreading areas (19), so as to dissipate heat over a large surface. Heat from the diodes (6) also transfers through the thickness of the alumina substrate (2) to the ground pad (20), the alumina having a thickness on the order of 0.015 to 0.025 inch, 3.81–6.35 mm.

With reference to FIGS. 1 and 4, a ground area (21) of metallization, for example, copper covered by a flash of gold, is interposed between each pair of output areas (9). The ground areas (21) insure electrical isolation of the output areas (9). The ground areas (21) are between capacitor pads (12), providing electrical isolation. Multiple connecting vias (13) connect each of the ground areas (21) to the corresponding heat conducting, ground pad (20) on the bottom surface (4) of the substrate (2).

Each of the surface mount pads (14, 18, 20) provides a corresponding electrical terminal for connection to a circuit board, for example, by solder connection of the surface mount pads (14, 18, 20), in a known manner, to a circuit board. Each of the pads (14, 18) is separated by a dam (11) from the ground pad (20). The dams (11) are fabricated of insulating material, for example, glass deposited as an overglaze on the bottom surface (4) of the substrate (2). The purpose of the dams (11) is to resist wicking or splashing of copper and gold materials used in the fabrication of the pads (14, 18, 20), and to prevent wicking of solder that is used for connection of the pads (14, 18, 20) to a circuit board.

With reference to FIGS. 2 and 5, electrical isolation of the surface mount pads (14, 18) is provided, for example, by the heat conducting, surface mount ground pad (20) encircling the common pad (14) that is connected to the common area (5), and by the heat conducting, surface mount pad (20) being interposed between the common pad (14) and each of the active pads (18). Glass dams, applied as an overglaze, extend in narrow strips along gaps between the heat conducting ground surface mount pad and each of the other surface mount pads. During deposition of copper and gold flash that forms the conducting pads, the dams prevent adhesion of copper and splashing and wicking of the metallization to assure that gaps are maintained for electrical separation of the pads from one another.

With reference to FIG. 2, each of the surface mount pads (14, 18, 20) is provided with a unitary tab (22) that extends to provide a unique pattern of tabs (22) that assists in orientation of the bottom surface (4) during manufacture and assembly of the package. With reference to FIGS. 1 and 4, a tab (22) is unitary with each of the ground areas (21), and each of the heat spreading areas (19), and extends to a corresponding edge margin of the top surface (3) of the substrate (2) to provide a unique pattern of tabs (22) that assists in orientation of the substrate (2) during manufacture and assembly of the package (1).

Figure 3:
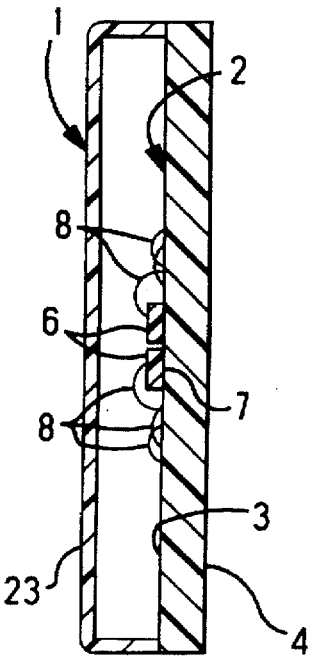
FIG. 3 is a section view of a package for diodes as shown in FIG. 1.
Figure 6:
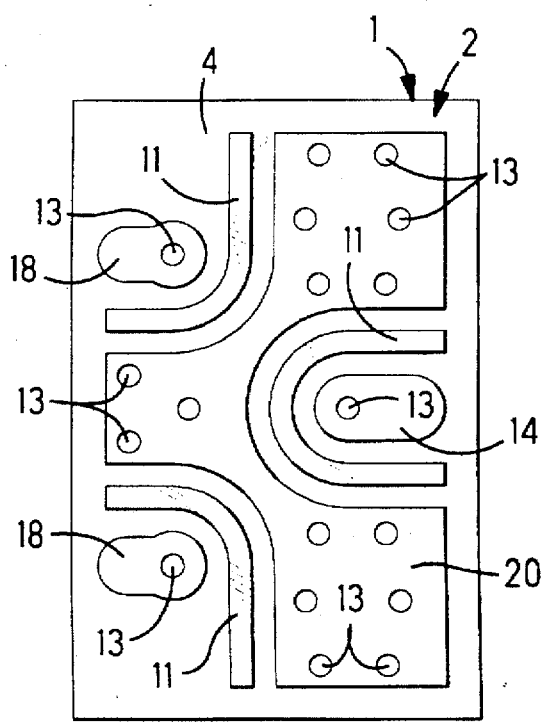
FIG. 6 is a section view of a package for diodes as shown in FIG. 4.

With reference to FIGS. 3 and 6, a hollow cover (23) is attached to the edge margin on the top surface (3) of the substrate (2), and encloses the top surface of the substrate. The hollow cover (23) eliminates encapsulant material and its accompanying capacitance. Edges of the hollow cover (23) are joined with adhesive, for example, BSE-1 B-stage epoxy, approximately 2 mils. thick, to edge margins of the substrate (2) along the top surface (3). For example, the cover (23) is available from Robison Electronics, Inc., 3580 Sacramento Drive, San Luis Obispo, Calif. 93403, USA part numbers, VSC-250100S4, VOC-150250S2 and VSC-150100S2. For example, the cover (23) has a height of about 0.100 inches, and covers a rectangular area bounded by sides having lengths of 0.150 inches or 0.250 inches, in any combination of such lengths.

Other embodiments and modifications of the invention are intended to be covered by the spirit and scope of the appended claims.

What is claimed is:

1. A package for diodes comprising:

a substrate of alumina, a conducting common area on a top surface of the substrate providing a mounting surface on which multiple diodes are mounted and electrically attached to a common port, bond wires extending from respective active areas on the diodes to connect with respective conducting output areas on the top surface, the common area and the output areas being connected by respective conducting vias to respective surface mount pads on a bottom surface of the substrate, conducting heat spreading areas on the top surface of the substrate, the heat spreading areas being separated from the common area by slender gaps, the heat spreading areas being disconnected from said bond wires and said conducting output areas, and multiple conducting vias connecting each of the heat spreading areas to a heat conducting, surface mount, ground pad on the bottom surface of the substrate.

2. A package for diodes as recited in claim 1 wherein each of the output areas comprises, a copper underlayment, gold flash adhered to the underlayment, and thick film gold pads applied to a portion of the gold flash, to which respective bond wires are attached.

3. A package for diodes as recited in claim 2 wherein, an insulating strip extends across each of the output areas to confine an edge of the thick film gold pad to said portion of the gold flash.

4. A package for diodes as recited in claim 1 wherein, an additional ground area on the top surface is interposed between the output areas, the additional ground area providing electrical isolation.

5. A package for diodes as recited in claim 1 wherein, thick film capacitor pads are on the top surface of the substrate, and wire bonds connect the thick film gold pads with the capacitor pads to compensate for inductance in the bond wires extending from respective diodes.

6. A package for diodes as recited in claim 5 wherein, an additional ground area on the top surface is between capacitor pads, the additional ground area providing electrical isolation.

7. A package for diodes as recited in claim 1 wherein, a hollow cover is attached to the substrate and encloses the top surface of the substrate.

8. A package for diodes as recited in claim 1 wherein, each of the vias comprises a plating lined opening through a thickness of the substrate, and epoxy filling the opening.

* * * * *